United States Patent
Sun et al.

(10) Patent No.: US 11,295,107 B2
(45) Date of Patent: Apr. 5, 2022

(54) DISPLAY PANEL

(71) Applicant: WUHAN CHINA STAR OPTOELECTRONICS TECHNOLOGY CO., LTD., Hubei (CN)

(72) Inventors: Weiting Sun, Hubei (CN); Huanhuan Bu, Wuhan Hubei (CN); Lixin Zhang, Hubei (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 118 days.

(21) Appl. No.: 16/615,852

(22) PCT Filed: Sep. 17, 2019

(86) PCT No.: PCT/CN2019/106100
§ 371 (c)(1),
(2) Date: Nov. 22, 2019

(87) PCT Pub. No.: WO2020/237912
PCT Pub. Date: Dec. 3, 2020

(65) Prior Publication Data
US 2021/0326556 A1  Oct. 21, 2021

(30) Foreign Application Priority Data
May 30, 2019  (CN) .......................... 201910461772.8

(51) Int. Cl.
*G06K 9/28* (2006.01)
*G06K 9/00* (2022.01)
*G06K 9/20* (2006.01)
*H01L 27/144* (2006.01)
*H01L 27/30* (2006.01)

(52) U.S. Cl.
CPC ......... *G06K 9/0004* (2013.01); *G06K 9/0002* (2013.01); *G06K 9/209* (2013.01); *H01L 27/144* (2013.01); *H01L 27/30* (2013.01)

(58) Field of Classification Search
CPC .......................... G06K 9/0004; G06K 9/0002
See application file for complete search history.

(56) References Cited

U.S. PATENT DOCUMENTS

2013/0044384 A1   2/2013 Kim et al.
2016/0266695 A1*  9/2016 Bae ...................... G06F 3/04166
2017/0147850 A1   5/2017 Liu et al.
(Continued)

FOREIGN PATENT DOCUMENTS

CN     1917230 A     2/2007
CN   104881196 A     9/2015
(Continued)

*Primary Examiner* — Brian Werner

(57) ABSTRACT

A display panel is provided, the display panel including a color filter substrate; a plurality of fingerprint pixels disposed on a side of the color filter substrate; a plurality of fingerprint pixels disposed on a side of the color filter substrate; wherein each of the fingerprint pixels comprises a pixel unit and a fingerprint sensor; and a first black matrix disposed between the adjacent pixel units, wherein the fingerprint sensor is disposed between the color filter substrate and the first black matrix.

12 Claims, 3 Drawing Sheets

(56) References Cited

U.S. PATENT DOCUMENTS

2019/0080131 A1     3/2019  Lee et al.
2019/0095046 A1*    3/2019  Guo ..................... B06B 1/0622
2019/0280039 A1     9/2019  Jia et al.
2020/0334436 A1*   10/2020  Xu ............................ G09F 9/33

FOREIGN PATENT DOCUMENTS

CN      106373969 A     2/2017
CN      109473453 A     3/2019
CN      208654487 U     3/2019

* cited by examiner

DISPLAY PANEL

CROSS-REFERENCE TO RELATED APPLICATIONS

This application is a 371 U.S. National Stage of International Application No. PCT/CN2019/106100, filed on Sep. 17, 2019, which claims priority to Chinese Application No. 201910461772.8, filed on May 30, 2019. The entire disclosures of the above applications are incorporated herein by reference.

FIELD OF INVENTION

The present invention relates to a field of display panel technologies, and in particular, to a display panel.

BACKGROUND OF INVENTION

With rapid development of technology, portable electronic devices such as smart phones, tablet personal computers (tablet PCs) or laptop personal computers (laptop PCs), have become a must-have tool in people's lives. The functions of electronic devices are increasingly diverse, and personal data, such as phone books, photos, and personal information, are usually stored with a certain privacy, and thus it is necessary to authenticate users of electronic devices. Although password protection has been used to prevent electronic devices from being used by others, passwords are easily leaked or cracked, and security is low. Moreover, the user needs to remember the password in order to use the electronic device, which brings a lot of inconvenience to the user. Therefore, the purpose of identifying personal fingerprints to achieve identity authentication has been developed.

Fingerprint imaging recognition technology is a technology that uses fingerprint sensors to collect fingerprint images of human body and then compares them with conventional fingerprint imaging information in the system to realize identity recognition. The implementation of fingerprint recognition technology includes optical imaging, capacitive imaging, and ultrasound imaging. However, the current fingerprint recognition module is disposed in the non-display area of the display panel, so that the fingerprint recognition area is small, and the display panel needs to reserve a space for the fingerprint recognition module, which results with difficulty in structural design.

SUMMARY OF INVENTION

Technical Problem

An embodiment of the present invention provides a display panel to solve the problems that a fingerprint recognition area of the conventional display panel is small and the relevant structural design is difficult.

Technical Solution

An embodiment of the invention provides a display panel, including:
  a color filter substrate;
  a plurality of fingerprint pixels disposed on a side of the color filter substrate; wherein each of the fingerprint pixels includes a pixel unit and a fingerprint sensor; and a first black matrix disposed between the adjacent pixel units, wherein the fingerprint sensor is disposed between the color filter substrate and the first black matrix.

Further, a second black matrix disposed on a side of the color filter substrate close to the fingerprint sensor, wherein the second black matrix is disposed corresponding to a trace and an electrode of the fingerprint sensor.

Further, a circular polarizer having a predetermined wavelength disposed on a side of the color filter substrate opposite another side of the color filter substrate facing the fingerprint pixels.

In one embodiment, the fingerprint sensor is an optical fingerprint sensor, and the optical fingerprint sensor includes a first thin film transistor and a photodiode electrically connected to the first thin film transistor.

Optionally, a material of the first black matrix is a conductive material, the photodiode includes a first electrode, an electron transporting layer, a body layer, and a hole transporting layer sequentially disposed between the color filter substrate and the first black matrix, and the first electrode electrically connected to a drain of the first thin film transistor.

Optionally, a material of the first black matrix is an insulating material, the photodiode includes a first electrode, an electron transporting layer, a body layer, a hole transporting layer, and a second electrode sequentially disposed between the color filter substrate and the first black matrix, and the first electrode electrically connected to a drain of the first thin film transistor.

Further, material of the body layer includes any one of amorphous silicon and photosensitive organic.

Further, a first thin film transistor includes a buffer layer, an active layer, a gate insulating layer, a gate electrode, an interlayer insulating layer, a source electrode, a drain electrode, a planarization layer, and a passivation layer sequentially disposed between the color filter substrate and the first black matrix, and the first electrode of the photodiode and the drain electrode of the first thin film transistor are disposed in the same layer and are electrically connected.

In another embodiment, the fingerprint sensor is an ultrasonic sensor, and the ultrasonic sensor includes a second thin film transistor and a piezoelectric chip electrically connected to the second thin film transistor.

Optionally, a material of the first black matrix is a conductive material, the piezoelectric chip includes a third electrode, a metallic layer, a dielectric layer, and a piezoelectric film layer sequentially disposed between the color filter substrate and the first black matrix, and the third electrode is electrically connected to a drain electrode of the second thin film transistor.

Optionally, a material of the first black matrix is an insulating material, the piezoelectric chip includes a third electrode, a metallic layer, a dielectric layer, a piezoelectric thin film layer, and a fourth electrode sequentially disposed between the color filter substrate and the first black matrix, and the third electrode is electrically connected to a drain electrode of the second thin film transistor.

Further, a material of the piezoelectric thin film layer includes any one of aluminum nitride, lead zirconate titanate, polyvinylidene fluoride and polyvinylidene fluoride-trifluoroethylene copolymers.

Further, an optical glue and a protective layer sequentially are disposed on a side of the color filter substrate opposite another side of the color filter facing an array substrate.

Further, a control chip is bound to a side of the display panel and is electrically connected to the fingerprint sensor.

Beneficial Effect

The invention has the beneficial effects as follows: a plurality of fingerprint pixels can be disposed on one side of the color filter substrate, a first black matrix is disposed between the pixel units of the plurality of fingerprint pixels, and a fingerprint sensor is disposed between the color filter substrate and the first black matrix, which can be used for full-screen fingerprint recognition function, and no need to make structural avoidance for fingerprint sensor, thereby reducing structural design difficulty and improving fingerprint recognition accuracy. Moreover, a second black matrix is disposed on a side of the color filter substrate close to the fingerprint sensor, or a circular polarizer having a predetermined wavelength is disposed on a side of the color filter substrate opposite another side of the color filter substrate facing the fingerprint pixels, which can be used to effectively prevent the reflection problem caused by bare metal trace in the fingerprint sensor.

BRIEF DESCRIPTION OF FIGURES

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF EMBODIMENTS

Figure 1:
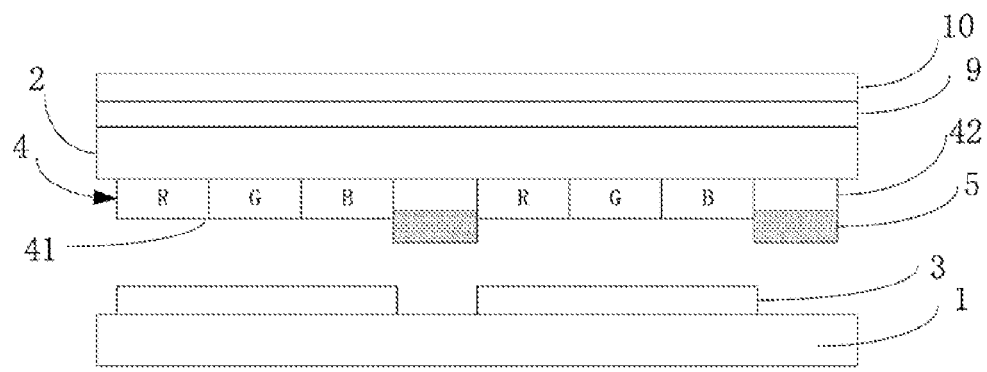
FIG. 1 is a schematic structural diagram of a display panel according to an embodiment of the present invention.

The preferred embodiments of the present invention are described below with reference to the accompanying drawings to illustrate that the present invention can be implemented. These embodiments can fully introduce the technical contents of the present invention to those skilled in the art, making the technical content of the present invention clear and easy to understand. However, the invention can be embodied in many different forms of embodiments, and the scope of the invention is not limited to the embodiments set forth herein.

The terminology used in the description of the invention is for the purpose of description. Expressions used in the singular encompasses the plural forms of expression unless the context clearly dictates otherwise. In the description of the present invention, it is to be understood that the terms such as "comprising", "including", and "having" are intended to mean that there is a possibility that the features, numbers, steps, acts, or combinations thereof are disclosed in the description of the invention, and are not intended to exclude the possibility of one or more other features, numbers, steps, actions or combinations thereof. The same reference numerals in the drawings denote the same parts.

Referring to FIG. 1, which is a schematic structural diagram of a display panel according to an embodiment of the present invention.

As shown in FIG. 1, the display panel provided in the present embodiment includes a color filter substrate 2, a plurality of fingerprint pixels 4, and a first black matrix 5. The plurality of fingerprint pixels 4 are disposed on one side of the color filter substrate 2, and each of the fingerprint pixels 4 includes a pixel unit 41 and a fingerprint sensor 42. The pixel unit 41 includes a plurality of color resistances, and the color resistances include red color resistance R, the green resistance G, and the blue resistance B. There is a gap between the color resistances of the adjacent pixel units in the fingerprint pixel 4, the first black matrix 5 is disposed at the gap between the color resistances of the adjacent pixel units, and the fingerprint sensor 42 is disposed between the color filter substrate 2 and the first black matrix 5.

Further, as shown in FIG. 1, the display panel further includes an array substrate 1 and a plurality of pixel electrodes 3. The array substrate 1 and the color filter substrate 2 are disposed opposite to each other, and the plurality of pixel electrodes 3, the plurality of fingerprint pixels 4, and the first black matrix 5 are disposed between the array substrate 1 and the color filter substrate 2. Specifically, the plurality of pixel electrodes 3 are disposed on one side of the array substrate 1 adjacent to the color filter substrate 2, and the plurality of pixel electrodes 3 are arranged in an array. The plurality of fingerprint pixels 4 are disposed on a side of the color filter substrate 2 adjacent to the array substrate 1, and the plurality of fingerprint pixels 4 are in one-to-one correspondence with the plurality of pixel electrodes 3.

Figure 2:
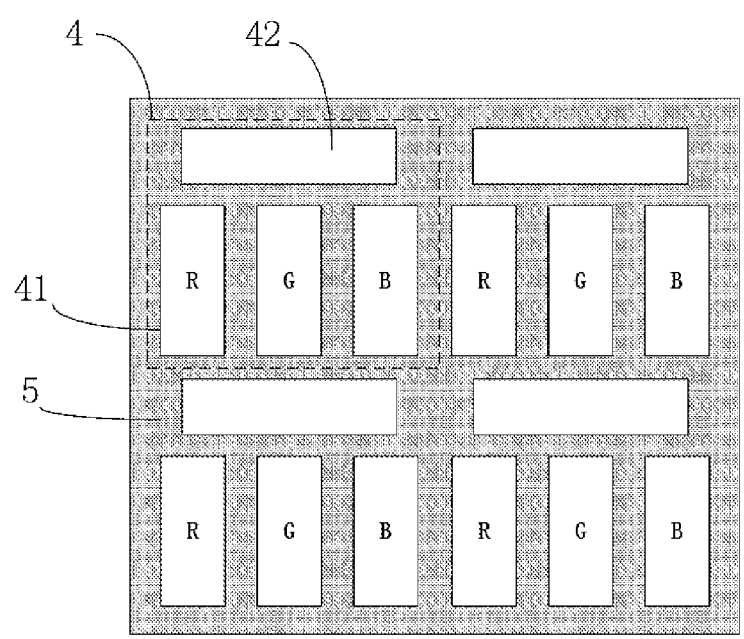
FIG. 2 is a positional relationship diagram between fingerprint pixels and a first black matrix in a display panel according to an embodiment of the present invention.

In one embodiment, the fingerprint sensor 42 is an optical fingerprint sensor 42 disposed between the color filter substrate 2 and the first black matrix 5 and does not completely cover the first black matrix 5. For example, as shown in FIG. 2, the pixel unit 41 in each fingerprint pixel 4 includes a horizontal arranged red color resistance R, a green color resistance G, a blue color resistance B, and a first black matrix 5 disposed between the color resistances of the adjacent pixel units 41. The first black matrix 5 is provided with an optical fingerprint sensor 42 corresponding to each of the pixel units 41, and each of the optical fingerprint sensors 42 is vertically aligned with its corresponding pixel unit 41.

Further, the optical fingerprint sensor 42 includes a first thin film transistor and a photodiode, and the first thin film transistor of the optical fingerprint sensor 42 and the photodiode are electrically connected.

Figure 3:
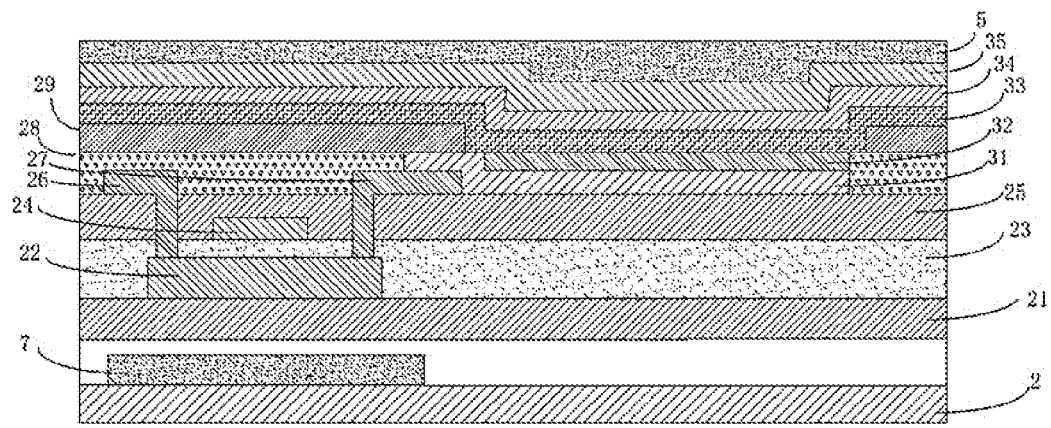
FIG. 3 is a partial structural diagram of the display panel according to an embodiment of the present invention.

As shown in FIG. 3, the first thin film transistor includes a buffer layer 21, an active layer 22, a gate insulating layer 23, a gate electrode 24, an interlayer insulating layer 25, a source electrode 26, a drain electrode 27, a planarization layer 28, and a passivation layer 29 which are sequentially disposed between the color filter substrate 2 and the first black matrix 5.

Specifically, the buffer layer 21 of the thin film transistor is disposed near the color filter substrate 2, the active layer 22 is disposed on the buffer layer 21, the gate insulating layer 23 is disposed on the buffer layer 21 and the active layer 22, the gate electrode 24 is disposed on the gate insulating layer 23, the interlayer insulating layer 25 is disposed on the gate insulating layer 23 and the gate electrode 24, the source electrode 26 and the drain electrode 27 are both disposed on the interlayer insulating layer 25, and the planarization layer 28 is disposed between the interlayer insulating layer 25, the gate electrode 24, and the drain electrode 27.

The first black matrix 5 can be a black matrix having no conductive properties, that is, material of the first black matrix 5 is an insulating material. The photodiode includes a first electrode 31, an electron transporting layer 32, a body layer 33, a hole transporting layer 34, and a second electrode 35 which are sequentially disposed between the color filter substrate 2 and the first black matrix 5. The material of the body layer 33 includes any one of amorphous silicon and photosensitive organic.

The first black matrix 5 can also be a black matrix having conductive properties, that is, material of the first black matrix 5 is a conductive material. The photodiode includes a first electrode 31, an electron transporting layer 32, a body layer 33, and a hole transporting layer 34 which are sequentially disposed between the color filter substrate 2 and the first black matrix 5. The first black matrix 5 serves as a second electrode of the photodiode.

In one embodiment, the first electrode 31 of the photodiode is disposed in the same layer and electrically connected to the drain electrode 27 of the thin film transistor, that is, the first electrode 31 of the photodiode is disposed on the interlayer insulating layer 25 and is in contact with the drain electrode 27 of the thin film transistor.

In another embodiment, the first electrode 31 of the photodiode is disposed on the interlayer insulating layer 25 and the drain electrode 27 of the thin film transistor, to increase a contact area of the first electrode 31 and the drain electrode 27 to ensure the electrical connection of the first electrode 31 and the drain electrode 27. Further, the passivation layer 29 is disposed on the planarization layer 28 and the first electrode 31. The electron transporting layer 32 is disposed on the first electrode 31. The body layer 33 is disposed on the passivation layer 29, the first electrode 31, the electron transporting layer 32, and the planarization layer 28. The hole transporting layer 34 is disposed on the body layer 33.

Figure 4:
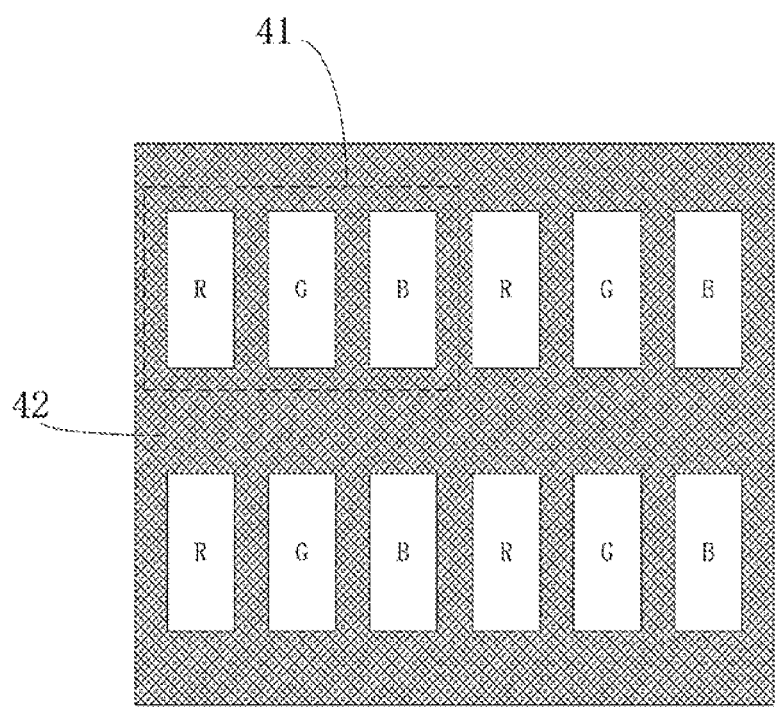
FIG. 4 is a schematic structural diagram of fingerprint pixels in the display panel according to an embodiment of the present invention.

In another embodiment, the fingerprint sensor 42 is an ultrasonic sensor 42 disposed between the color filter substrate 2 and the first black matrix 5 and completely covering the first black matrix 5. For example, as shown in FIG. 4, the pixel unit 41 in each fingerprint pixel 4 includes a horizontal arranged red color resistance R, a green color resistance G, a blue color resistance B, and an ultrasonic sensor 42 is disposed on an entire surface of the first black matrix 5 between color resistances of the adjacent pixel units 41.

Further, the ultrasonic sensor 42 includes a second thin film transistor and a piezoelectric chip electrically connected to the second thin film transistor.

Figure 5:
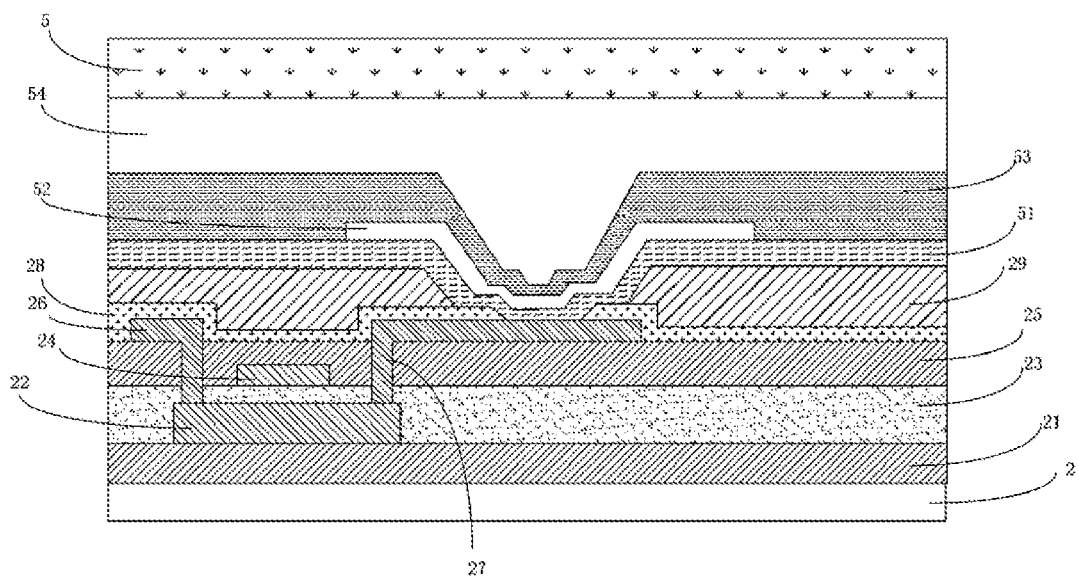
FIG. 5 is a schematic structural diagram of a portion of the display panel according to an embodiment of the present disclosure.

As shown in FIG. 5, the second thin film transistor includes a buffer layer 21, an active layer 22, a gate insulating layer 23, a gate electrode 24, an interlayer insulating layer 25, a source electrode 26, a drain electrode 27, a planarization layer 28, and a passivation layer 29 which are sequentially disposed between the color filter substrate 2 and the first black matrix 5.

Specifically, the buffer layer 21 of the thin film transistor is disposed near the color filter substrate 2, the active layer 22 is disposed on the buffer layer 21, the gate insulating layer 23 is disposed on the buffer layer 21 and the active layer 22, the gate electrode 24 is disposed on the gate insulating layer 23, the interlayer insulating layer 25 is disposed on the gate insulating layer 23 and the gate electrode 24, the source electrode 26 and the drain electrode 27 are both disposed on the interlayer insulating layer 25, and the planarization layer 28 is disposed between the interlayer insulating layer 25, the gate electrode 24, and the drain electrode 27. The passivation layer 29 is disposed on the planarization layer 28.

The first black matrix 5 can be a black matrix having no conductive properties, that is, the material of the first black matrix 5 is an insulating material. The piezoelectric chip includes a third electrode 51, a metallic layer 52, a dielectric layer 53, a piezoelectric film layer 54, and a fourth electrode which are sequentially disposed between the color filter substrate 2 and the first black matrix 5. Among them, the metallic layer 52 serves to prevent the third electrode from being broken. The material of the piezoelectric film layer 54 includes any one of aluminum nitride (AlN), lead zirconate titanate (PZT), polyvinylidene fluoride (PVDF), and polyvinylidene fluoride-trifluoroethylene copolymers P(VDF-TrFE).

The first black matrix 5 can also be a black matrix having conductive properties, that is, the material of the first black matrix 5 is a conductive material. The piezoelectric chip includes a third electrode 51, a metallic layer 52, a dielectric layer 53, and a piezoelectric film layer 54 which are sequentially disposed between the color filter substrate 2 and the first black matrix 5. Among them, the first black matrix 5 serves as a fourth electrode of the piezoelectric chip.

Further, an opening corresponding to the drain electrode 27 is formed on the planarization layer 28 and the passivation layer 29 of the second thin film transistor. The third electrode 51 is disposed on the planarization layer 28 and the passivation layer 29, and is filled in the opening for in contact with the drain electrode 27 of the second thin film transistor, which is used to electrically connect the third electrode 51 and the drain electrode 27 of the second thin film transistor. Further, the metallic layer 52 is disposed on the third electrode 51, the dielectric layer 53 is disposed on the third electrode 51 and the metallic layer 52, and the piezoelectric film layer 54 is disposed on the dielectric layer 53.

Further, since the first thin film transistor or the second thin film transistor is disposed between the color filter substrate 2 and the first black matrix 5, the reflection problem caused by the bare conductive line can be introduced. Therefore, it is necessary to provide an obstruction at the color filter substrate 2 to avoid reflections.

In a specific embodiment, as shown in FIG. 3, a side of the color filter substrate 2 adjacent to the thin film transistor is provided with a second black matrix 7 having high temperature resistant, and the second black matrix 7 corresponds to the position of the first thin film transistor or the second thin film transistor for shielding the traces and electrodes of the first thin film transistor or the second thin film transistor. Therebetween, the traces and electrodes of the thin film transistor are made of an opaque conductive material such as metal. Specifically, the second black matrix 7 corresponds to the positions of the gate 24, the source 26, and the drain electrode 27 of the first thin film transistor or the second thin film transistor. In addition, in the optical fingerprint sensor, a position of the second black matrix 7 does not correspond to a position of the photodiode to ensure that the photodiode is sensitive to the fingerprint.

Figure 6:
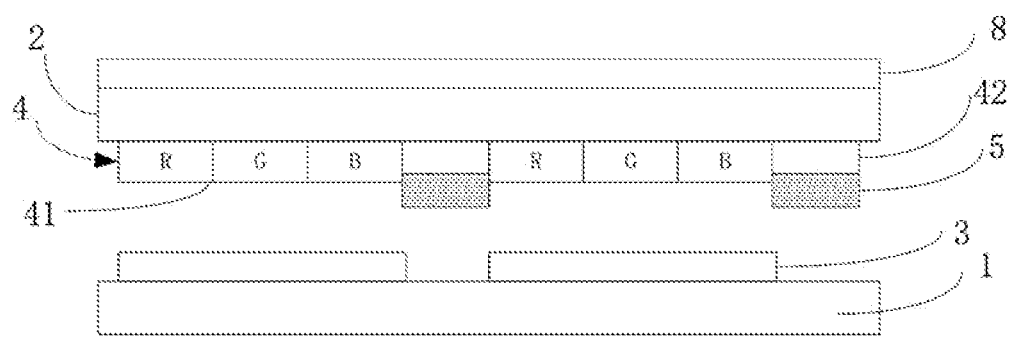
FIG. 6 is another schematic structural diagram of the display panel according to an embodiment of the present invention.

In another specific embodiment, as shown in FIG. 6, a circular polarizer 8 having a predetermined wavelength is disposed on a side of the array substrate 1, for example, a quarter-wavelength circular polarizer 8. A quarter wavelength circular polarizer 8 is used as an upper polarizer of the display panel to change the phase of the illuminated light by a quarter wavelength after passing through the circular polarizer 8, so that the reflected light can be absorbed by the circular polarizer 8.

Further, as shown in FIG. 1, an optical glue 9 and a protective layer 10 are sequentially disposed on a side of the color filter substrate 2 opposite another side of the color filter facing an array substrate 1.

Specifically, the optical glue 9 is disposed on a side of the color filter substrate 2 away from the array substrate 1, and the protective layer 10 is disposed on a side of the optical glue away from the color filter substrate 2. The protective layer 10 is a light transmissive material, such as glass, sapphire, and transparent polymer material, for protecting a display module and a fingerprint module.

Further, a side of the display panel is further bound with a control chip electrically connected to the fingerprint sensor.

It should be noted that when the fingerprint is recognized by the optical fingerprint sensor, the light intensity reflected from the valley and crest of the fingerprint is not consistent, so that the voltage drop generated at both ends of the photosensitive diode is different, and then the photosensitive diode produces different current value, and the current value is transmitted to the control chip through the thin film transistor, and an image of the fingerprint is displayed after information processing of the control chip.

It should be noted that the display panel in this embodiment further includes a touch structure, and the touch structure can be disposed on the array substrate of the display panel, or can be externally mounted on the display panel, and is not specifically limited herein.

It can be seen from the above that the display panel provided in the embodiments of the present invention, which a plurality of fingerprint pixels can be disposed on one side of the color filter substrate, a first black matrix is disposed between the pixel units of the plurality of fingerprint pixels, and a fingerprint sensor is disposed between the color filter substrate and the first black matrix, which can be used for full-screen fingerprint recognition function, and no need to make structural avoidance for fingerprint sensor, thereby reducing structural design difficulty and improving fingerprint recognition accuracy. Moreover, a second black matrix is disposed on a side of the color filter substrate close to the fingerprint sensor, or a circular polarizer having a predetermined wavelength is disposed on a side of the color filter substrate opposite another side of the color filter substrate facing the fingerprint pixels, which can be used to effectively prevent the reflection problem caused by bare metal trace in the fingerprint sensor.

Embodiments of the present invention have been described, but not intending to impose any unduly constraint to the appended claims. For a person skilled in the art, any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. A display panel, comprising:
   a color filter substrate;
   a plurality of fingerprint pixels disposed on a side of the color filter substrate; wherein each of the fingerprint pixels comprises a pixel unit and a fingerprint sensor; and
   a first black matrix disposed between the adjacent pixel units, wherein the fingerprint sensor is disposed between the color filter substrate and the first black matrix, the fingerprint sensor is an optical fingerprint sensor, and the optical fingerprint sensor comprises a first thin film transistor and a photodiode electrically connected to the first thin film transistor; and
   wherein a material of the first black matrix is a conductive material, the photodiode comprises a first electrode, an electron transporting layer, a body layer, and a hole transporting layer sequentially disposed between the color filter substrate and the first black matrix; the first electrode electrically connected to a drain of the first thin film transistor.

2. The display panel of claim 1, further comprising a second black matrix disposed on a side of the color filter substrate close to the fingerprint sensor, wherein the second black matrix is disposed corresponding to a trace and an electrode of the fingerprint sensor.

3. The display panel of claim 1, further comprising a circular polarizer having a predetermined wavelength disposed on a side of the color filter substrate opposite another side of the color filter substrate facing the fingerprint pixels.

4. The display panel of claim 1, wherein a material of the first black matrix is an insulating material, the photodiode comprises a first electrode, an electron transporting layer, a body layer, a hole transporting layer, and a second electrode sequentially disposed between the color filter substrate and the first black matrix, and the first electrode electrically connected to a drain of the first thin film transistor.

5. The display panel of claim 1, wherein material of the body layer comprises any one of amorphous silicon and photosensitive organic.

6. The display panel of claim 1, wherein the first thin film transistor comprises a buffer layer, an active layer, a gate insulating layer, a gate electrode, an interlayer insulating layer, a source electrode, a drain electrode, a planarization layer, and a passivation layer sequentially disposed between the color filter substrate and the first black matrix, and the first electrode of the photodiode and the drain electrode of the first thin film transistor are disposed in the same layer and are electrically connected.

7. The display panel of claim 1, wherein the fingerprint sensor is an ultrasonic sensor, and the ultrasonic sensor comprises a second thin film transistor and a piezoelectric chip electrically connected to the second thin film transistor.

8. The display panel of claim 7, wherein a material of the first black matrix is a conductive material, the piezoelectric chip comprises a third electrode, a metallic layer, a dielectric layer, and a piezoelectric film layer sequentially disposed between the color filter substrate and the first black matrix, and the third electrode is electrically connected to a drain electrode of the second thin film transistor.

9. The display panel of claim 7, wherein a material of the first black matrix is an insulating material, the piezoelectric chip comprises a third electrode, a metallic layer, a dielectric layer, a piezoelectric thin film layer, and a fourth electrode sequentially disposed between the color filter substrate and the first black matrix, and the third electrode is electrically connected to a drain electrode of the second thin film transistor.

10. The display panel of claim 8, wherein a material of the piezoelectric thin film layer comprises any one of aluminum nitride, lead zirconate titanate, polyvinylidene fluoride and polyvinylidene fluoride-trifluoroethylene copolymers.

11. The display panel of claim 1, further comprising an optical glue and a protective layer sequentially disposed on a side of the color filter substrate opposite another side of the color filter facing an array substrate.

12. The display panel of claim 1, further comprising a control chip bound to a side of the display panel and electrically connected to the fingerprint sensor.

\* \* \* \* \*